US011248293B2

(12) United States Patent
Kuwada et al.

(10) Patent No.: US 11,248,293 B2
(45) Date of Patent: Feb. 15, 2022

(54) FILM-FORMING APPARATUS AND FILM-FORMING METHOD

(71) Applicant: TOKYO ELECTRON LIMITED, Tokyo (JP)

(72) Inventors: Hirotaka Kuwada, Nirasaki (JP); Yu Nunoshige, Nirasaki (JP); Yasushi Fujii, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 19 days.

(21) Appl. No.: 16/557,285

(22) Filed: Aug. 30, 2019

(65) Prior Publication Data

US 2020/0071831 A1   Mar. 5, 2020

(30) Foreign Application Priority Data

Aug. 31, 2018 (JP) .............................. JP2018-163155

(51) Int. Cl.
C23C 16/455 (2006.01)
H01L 21/02 (2006.01)
(Continued)

(52) U.S. Cl.
CPC .... C23C 16/45565 (2013.01); C23C 16/4405 (2013.01); C23C 16/4586 (2013.01);
(Continued)

(58) Field of Classification Search
CPC ........ C23C 16/45565; C23C 16/45563; C23C 16/45568; C23C 16/4405; C23C 16/45544
See application file for complete search history.

(56) References Cited

U.S. PATENT DOCUMENTS 5,463,212 A * 10/1995 Oshima ..................... G06K 7/12
                                                              235/454
2002/0062837 A1 * 5/2002 Miyanaga ........... C23C 16/4405
                                                              134/1
(Continued)

FOREIGN PATENT DOCUMENTS

CN          102414799 A        4/2012
EP          0839930 B1 *       4/2003   ............. C23C 16/44
(Continued)

OTHER PUBLICATIONS

Sanders, S., et al., "Showerhead-assisted chemical vapor deposition of CsPbBr3 films for LED applications". Journal of Materials Research (2021) pp. 1-11, https://doi.org/10.1557/s43578-021-00239-w.*
(Continued)

Primary Examiner — Bret P Chen
(74) Attorney, Agent, or Firm — Nath, Goldberg & Meyer; Jerald L. Meyer; Tanya E. Harkins

(57) ABSTRACT

An apparatus includes: a vacuum container having a vacuum atmosphere for a film forming process on each substrate; a stage for heating the substrate mounted thereon; a shower head including a facing portion that faces the stage and ejection ports opened in the facing portion, which supplies a film-forming gas to the substrate through the ports so as to form a film on the substrate; a cleaning gas supply part for supplying a cleaning gas into the container to clean the interior of the container in a state where no substrate is accommodated in the container while the film forming process is applied on the each of the plurality of substrates; and a non-porous coating film for covering a base material constituting the shower head at least in the facing portion to form a surface of the shower head when the film-forming gas is supplied to each substrate.

6 Claims, 10 Drawing Sheets

(51) Int. Cl.
    *C23C 16/458*     (2006.01)
    *C23C 16/44*     (2006.01)

(52) U.S. Cl.
    CPC .. *C23C 16/45527* (2013.01); *C23C 16/45544* (2013.01); *C23C 16/45563* (2013.01); *H01L 21/0228* (2013.01); *H01L 21/02186* (2013.01)

(56) References Cited

U.S. PATENT DOCUMENTS

| | | | | |
|---|---|---|---|---|
| 2005/0022735 | A1* | 2/2005 | Breitung | C23C 16/5096 |
| | | | | 118/715 |
| 2005/0235918 | A1* | 10/2005 | Kojima | C23C 16/463 |
| | | | | 118/733 |
| 2008/0000424 | A1* | 1/2008 | Bailey | C23C 16/45565 |
| | | | | 118/715 |
| 2008/0124932 | A1* | 5/2008 | Tateishi | H01L 21/02074 |
| | | | | 438/692 |
| 2008/0245388 | A1* | 10/2008 | Moriya | B08B 3/12 |
| | | | | 134/1 |
| 2009/0159001 | A1* | 6/2009 | Um | C23C 16/45565 |
| | | | | 118/715 |
| 2009/0251715 | A1* | 10/2009 | Kita | H04N 1/60 |
| | | | | 358/1.9 |
| 2009/0266911 | A1* | 10/2009 | Kim | C23C 16/45574 |
| | | | | 239/265.11 |
| 2010/0068880 | A1* | 3/2010 | Hatanaka | H01L 21/28556 |
| | | | | 438/627 |
| 2011/0139372 | A1* | 6/2011 | Blonigan | H01L 21/67754 |
| | | | | 156/345.34 |
| 2011/0240224 | A1* | 10/2011 | Yoshimura | H01J 37/32568 |
| | | | | 156/345.47 |
| 2013/0270362 | A1* | 10/2013 | Sferlazzo | C23C 16/52 |
| | | | | 239/225.1 |
| 2017/0183775 | A1* | 6/2017 | Yamamoto | C23C 16/345 |

FOREIGN PATENT DOCUMENTS

| | | |
|---|---|---|
| JP | 2006-128370 A | 5/2006 |
| JP | 2013-007121 A | 1/2013 |
| KR | 101860203 B1 | 5/2018 |
| WO | WO 2007/074678 A1 * 7/2007 | ............. C23C 16/44 |

OTHER PUBLICATIONS

Sanders, S., et al., "Showerhead-Assisted Chemical Vapor Deposition of Perovskite Films for Solar Cell Application". MRS Advances, 2020 Materials Research Society, pp. 385-393. DOI: 10.1557/adv.2020.126.*

Xia, Huanxiong, et al., "Simulation-Based Optimization of a Vector Showerhead System for the Control of Flow Field Profile in a Vertical Reactor Chamber". Advances in Mechanical Engineering vol. 2014, Article ID 525102, 9 pages http://dx.doi.org/10.1155/2014/525102.*

Kim, Min Su, et al., "Effect of seasoning-layer stress on fluorine diffusion". AIP Advances 10, 085103 (2020), pp. 1-7.*

Wack, Sabrina, et al., "Two-Step Approach for Conformal Chemical Vapor-Phase Deposition of Ultra-Thin Conductive Silver Films". Applied Materials & Interfaces, 2020, 12, 36329-36338.*

Sanders, S., et al., "Showerhead assisted chemical vapor deposition of CsPbBr3 flms for LED applications". Journal of Materials Research, vol. 36, Issue 9, May 2021, pp. 1813-1823.*

* cited by examiner

FIG. 5
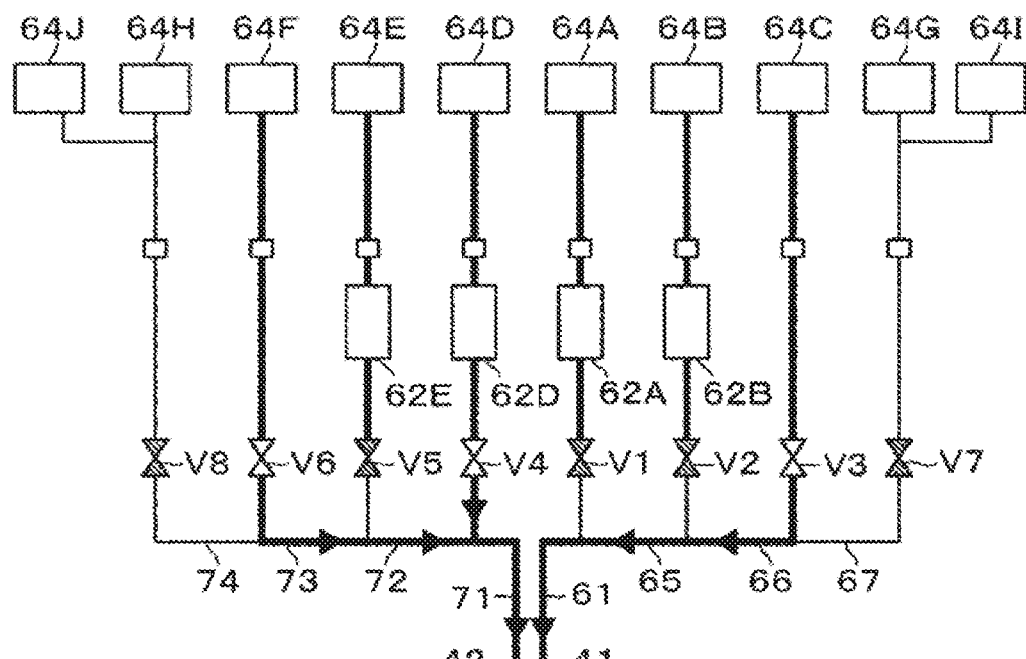
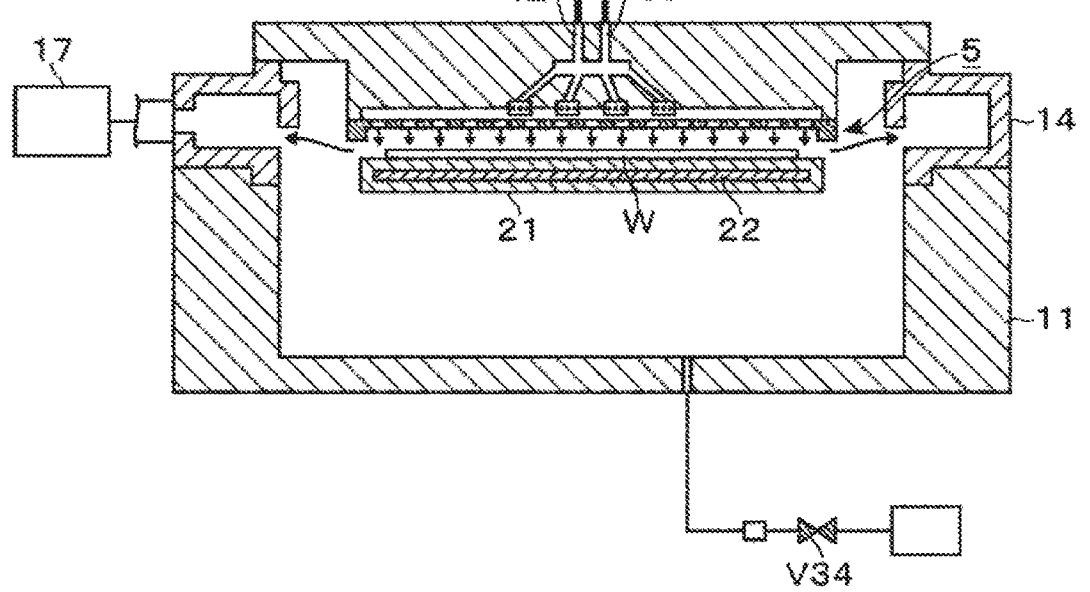

FILM-FORMING APPARATUS AND FILM-FORMING METHOD

CROSS-REFERENCE TO RELATED APPLICATION

This application is based upon and claims the benefit of priority from Japanese Patent Application No. 2018-163155, filed on Aug. 31, 2018, the entire contents of which are incorporated herein by reference.

TECHNICAL FIELD

The present disclosure relates to a film-forming apparatus and a film-forming method.

BACKGROUND

There is a case where a gas process such as an atomic layer deposition (ALD) or chemical vapor deposition (CVD)-based film formation is performed on a semiconductor wafer (hereinafter, referred to as a "wafer") which is a substrate. In such a gas process, for example, a gas is supplied toward the wafer in the form of a shower. Patent Document 1 discloses a film-forming apparatus that forms a film on a wafer using a film-forming raw material made of a metal alkoxide. The film-forming apparatus includes a processing container made of a metal. An inner wall surface of the processing container is coated with a nonporous anodic oxide film to prevent the elution of a metal component by the above-mentioned metal alkoxide.

PRIOR ART DOCUMENT

Patent Documents

Patent Document 1: Japanese Laid-Open Patent Publication No. 2006-128370

SUMMARY

According to an embodiment of the present disclosure, there is provided a film-forming apparatus including: a vacuum container having a vacuum atmosphere formed therein configured for a film forming process on each of a plurality of substrates; a stage provided within the vacuum container and configured to heat the substrate mounted on the stage; a shower head including a facing portion formed to face the stage and a plurality of gas ejection ports opened in the facing portion, the shower head configured to supply a film-forming gas to the substrate heated through the plurality of gas ejection ports so as to form a film on the substrate; a cleaning gas supply part configured to supply a cleaning gas into the vacuum container to clean the interior of the vacuum container in a state where no substrate is accommodated in the vacuum container while the film forming process is applied on each of the plurality of substrates; and a non-porous coating film configured to cover a base material constituting the shower head at least in the facing portion and form a surface of the shower head, such that a fluctuation in a heat reflectance in the shower head when the film-forming gas is supplied to each of the plurality of substrates is alleviated.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a schematic view for explaining a process performed by the film-forming apparatus.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
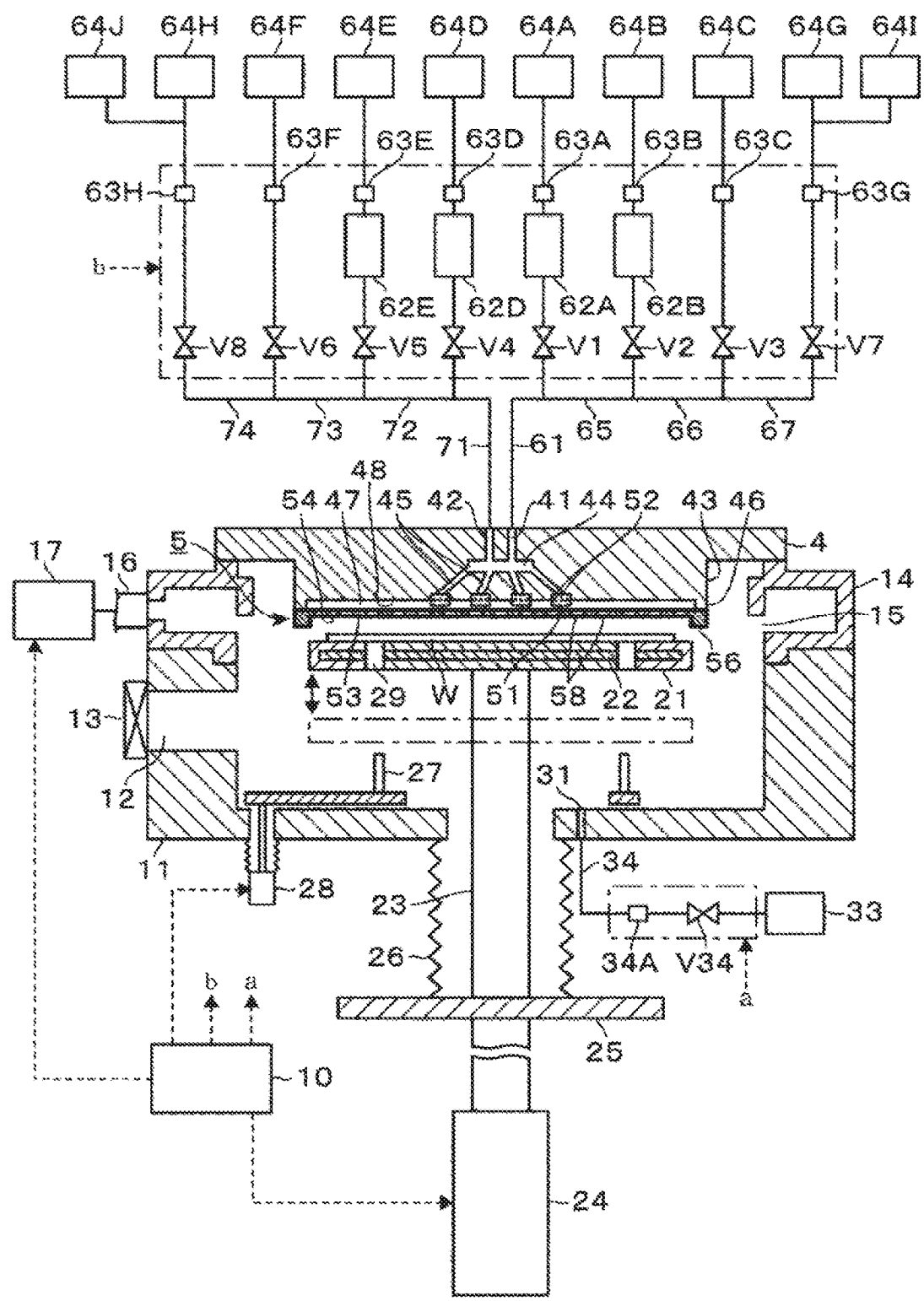
FIG. 1 is a vertical cross-sectional view of a film-forming apparatus according to an embodiment of the present disclosure.

A film-forming apparatus 1 according to an embodiment of the present disclosure will be described with reference to a vertical cross-sectional view of FIG. 1. The film-forming apparatus 1 includes a processing container 11 as a circular vacuum container. The film-forming apparatus 1 performs an ALD process on a wafer W to form a TiN (titanium nitride) film on the wafer W. The ALD process alternately supplies a $TiCl_4$ (titanium tetrachloride) gas as a raw material gas and an $NH_3$ (ammonia) gas as a reaction gas with respect to the wafer W in a repetitive manner. The wafer W is a circular silicon substrate having a diameter of 300 mm. The $TiCl_4$ gas and the $NH_3$ gas are film-forming gases used in forming a film on the wafer W. An $N_2$ (nitrogen) gas as an inert gas is supplied as a purge gas between a timing at which the $TiCl_4$ gas is supplied and a timing at which the $NH_3$ gas is supplied. Thus, an internal atmosphere of the processing container 11 is replaced with an $N_2$ gas atmosphere from a $TiCl_4$ gas atmosphere or an $NH_3$ gas atmosphere. During the ALD-based film-forming process, the $N_2$ gas is continuously supplied into the processing container 11 as a carrier gas for introducing the $TiCl_4$ gas and the $NH_3$ gas into the processing container 11.

In addition, in the film-forming apparatus 1, for example, after the film-forming process is performed on the plurality of wafers W, a cleaning gas such as a chlorine trifluoride ($ClF_3$) gas is supplied into the processing container 11 in which no wafer W is accommodated. Then, a cleaning process is performed to remove a TiN film adhering to each part inside the processing container 11. Therefore, in the film-forming apparatus 1, the film-forming process of the plurality of wafers W and the cleaning process are alternately performed in a repetitive manner. That is to say, in the case where the film-forming process is performed on each of the wafers W, the cleaning process is performed between the film-forming processes.

A loading/unloading port 12 through which the wafer W is transferred and a gate valve 13 for opening/closing the loading/unloading port 12 are provided in a sidewall of the processing container 11. An exhaust duct 14, which constitutes a portion of the processing container 11 and is formed by bending a rectangular duct having a rectangular cross-section shape in an annular shape when viewed from the top, is provided above the loading/unloading port 12. An exhaust port 15 is formed in a sidewall of an inner peripheral side of the exhaust duct 14 in the circumferential direction of the exhaust duct 14. The exhaust duct 14 is coupled to an exhaust mechanism 17 including a pressure control valve, a vacuum pump and the like through an exhaust pipe 16. The degree of opening of the pressure control valve is adjusted based on a control signal provided from a controller 10 described later. Exhaust is performed from the exhaust port 15 so that the processing container 11 is kept in a vacuum atmosphere having a desired pressure.

A circular stage 21 having a horizontal front surface (upper surface) is provided inside the processing container 11. A heater 22 is embedded in the stage 21 constituting a mounting part to heat the wafer W at, for example, 400 degrees C. to 700 degrees C. A central lower portion of the stage 21 is supported on an upper end of a support column 23. A lower end of the support column 23 penetrates a bottom portion of the processing container 11 and is connected to a lifting mechanism 24. By the lifting mechanism 24, the stage 21 is raised and lowered between a lower position indicated by a chain line in FIG. 1 and an upper position indicated by a solid line in FIG. 1. The lower position is a position at which the wafer W is delivered to/from a wafer transfer mechanism entering the processing container 11 through the loading/unloading port 12. The upper position is a position at which the wafer W is processed.

Reference numeral 25 in FIG. 1 denotes a flange provided in the support column 23 below the bottom portion of the processing container 11. Reference numeral 26 in FIG. 1 denotes an extendible bellows. An upper end of the bellows 26 is connected to the bottom portion of the processing container 11 and a lower end thereof is connected to the flange 25 so that the interior of the processing container 11 is kept in an air-tight state. In FIG. 1, reference numeral 27 denotes three (only two are illustrated in FIG. 1) support pins. Reference numeral 28 in FIG. 1 denotes a lifting mechanism that moves up and down the support pins 27. Through-holes 29 are formed in the stage 21. When the stage 21 is located at the lower position, the support pins 27 are moved upward and downward on the front surface of the stage 21 through the respective through-holes 29. Thus, the wafer W can be delivered between the wafer transfer mechanism and the support pins 27.

A gas supply port 31 is opened in the bottom portion of the processing container 11. A cleaning gas ($ClF_3$ gas) source 33 is coupled to the gas supply port 31 through a gas supply pipe 34. A valve V34 and a flow rate adjuster 34A are provided in the gas supply pipe 34 in this order toward the downstream side. The flow rate adjuster 34A and each flow rate adjuster (to be described later) include a mass flow controller, respectively, and are configured to be capable of adjusting a flow rate of each cleaning gas supplied from respective gas sources toward the downstream side of respective pipes.

A ceiling plate 4 is provided on the exhaust duct 14 so as to close the processing container 11 from the top. Two gas introduction paths 41 and 42 are formed in an upper portion of the ceiling plate 4 to extend in the vertical direction. A lower central portion of the ceiling plate 4 protrudes downward to form a circular protruded portion 43. The protruded portion 43 includes a flat space 44 and a plurality of gas flow paths 45 that is formed to extend obliquely downward at different positions below the flat space 44. Each of lower ends of the gas introduction paths 41 and 42 is connected to an upper portion of the flat space 44.

A peripheral edge of the protruded portion 43 further protrudes downward to form an annular support protrusion 46. A circular shower head 5 is provided to be supported by a lower end of the support protrusion 46. A peripheral portion of the shower head 5 is formed along the circumference of the support protrusion 46. A space surrounded by the shower head 5 and the support protrusion 46 is defined as a flat diffusion space 47. A ceiling surface of the diffusion space 47 is denoted by reference numeral 48. A plurality of circular gas dispersion portions 51 are provided to protrude downward from the ceiling surface 48. Each of lower ends of the plurality of gas flow paths 45 is respectively connected to a flow path (not illustrated) formed in each of the plurality of gas dispersion portions 51. A plurality of gas ejection holes 52 is formed in a side peripheral surface of each of the gas dispersion portions 51 at intervals in the circumferential direction. A gas supplied from the gas flow path 45 to the gas dispersion portions 51 is ejected from each gas ejection hole 52 and laterally diffuses inside the diffusion space 47.

Figure 2:
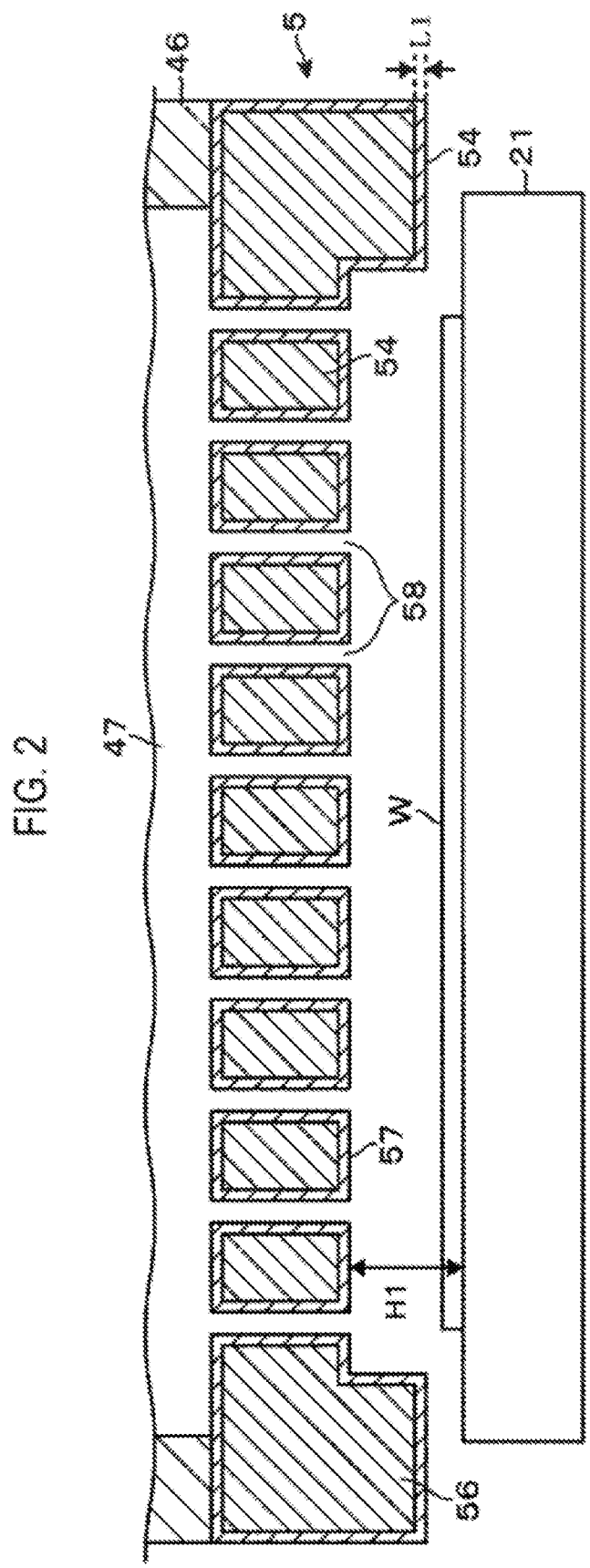
FIG. 2 is a vertical cross-sectional side view of a shower head constituting the film-forming apparatus.

Next, the shower head 5 will be described also with reference to FIG. 2, which is a schematic vertical cross-sectional view of the shower head 5. The shower head 5 includes a base 53 made of metal, and a coating film 54 that covers the base 53 to form a front surface of the shower head 5. The base 53 may be formed of an aluminum alloy containing magnesium as a major additive. More specifically, the base 53 may be formed of A5052 according to the JIS standard or an equivalent industrial standard product. The coating film 54 is a metal film. More specifically, the coating film 54 is formed of non-porous alumite ($Al_2O_3$). The coating film 54 formed of such alumite may be formed by anodizing the front surface of the shower head 5. More specifically, the coating film 54 may be formed by OGF (OUT GAS FREE (registered trademark) treatment). The coating film 54 is a corrosion-resistant protective film for protecting the base 53 against the cleaning gas. As described above, the coating film 54 is non-porous. Such a non-porous film is referred to as a film having a porosity of 1% or less. Thus, the coating film 54 is not limited to a film that does not include any holes at all.

The peripheral portion of the shower head 5 protrudes downward to form an annular protrusion 56 close to a peripheral portion of the stage 21. An area surrounded by the annular protrusion 56 on the lower surface of the shower head 5 forms a horizontal facing portion 57 that faces the stage 21. A large number of ejection ports 58 are dispersedly formed in the facing portion 57. Each of the ejection port 58 is vertically drilled to be in communication with the diffusion space 47. A gas supplied into the diffusion space 47 is supplied toward the stage 21 in the form of a shower via the ejection ports 58. A distance H1 between the front surface of the stage 21 and the facing portion 57 at the upper position may fall within a range of 5 mm to 10 mm. In this example, the coating film 54 is formed to cover the entire shower head 5. A film thickness L1 of the coating film 54 may fall within a range of 0.5 µm to 0.7 µm.

The reason for forming the above-mentioned coating film 54 will be described. As described above, in the film-forming apparatus 1, the film-forming process and the cleaning process are repeatedly performed on the plurality of wafers W. As will be described in the following evaluation tests, in a state where the coating film 54 is not formed, when the film-forming process and the cleaning process are repeated using a shower head in which the base 53 is exposed, it was found that fluctuation in film thickness of TiN films occurs between respective wafers W even if processing conditions applied in the respective film-forming processes are the same. Hereinafter, the shower head in which the base 53 is exposed will be referred to as a comparative shower head.

The reason for occurring the fluctuation in film thickness as described above appeared to be that the repetitive execution of the film-forming process changes a film thickness accumulated on the comparative shower head, and the exposure of the comparative shower head to the cleaning gas modifies the front surface of the comparative shower head, which causes a change in heat reflectance. The factors of the film thickness fluctuation will be described in more detail. During the film-forming process, the stage 21 is heated such that the wafer W mounted on the stage 21 has a relatively high temperature of 400 degrees C. or higher. Heat radiated from the stage 21 and the wafer W heated to such a high temperature is reflected at the facing portion 57 disposed to face the stage 21 in the comparative shower head. The reflected heat is supplied to the wafer W. However, the reflectance of heat in the comparative shower head fluctuates due to the above-described factors. Thus, the heat balance between the shower head and the wafer W changes. That is to say, the temperatures of the wafers W fluctuate during the film-forming process, which varies the reactivity of the gas with respect to the wafers W every film-forming process. Thus, it was presumed that the fluctuation in film thickness of TiN films occurs between the wafers W. The coating film 54 is formed to alleviate the fluctuation in heat reflectance on the front surface of the shower head 5 for each film-forming process, and to make uniform the film thicknesses of TiN films between the wafers W. From the results of evaluation tests described later, it was founded that the formation of the coating film 54 suppresses the fluctuation in heat reflectance and alleviates the fluctuation in film thickness of the TiN film.

Controlling the reflectance in the shower head 5 with respect to the radiant heat from the stage 21 to the shower head 5 corresponds to controlling the reflectance of radioactive rays such as infrared rays emitted from the stage 21. When heating the wafer W, the reflectance of infrared rays having a wavelength of 3 µm to 7 min has a relatively large influence on the temperature of the wafer W. In some embodiments, the shower head 5 may be configured such that the reflectance available when the infrared rays having a wavelength of 3 µm to 7 µm is irradiated is close to that in the above-described comparative shower head in which the film-forming process and the cleaning process are repeatedly performed. The reason for this is as follows. Even if the comparative shower head is used, in each film-forming process after the film-forming process and the cleaning process have been repeated multiple times, a change in thickness of the film formed on the wafer W is suppressed and thus the film thickness becomes stable. Even though the comparative shower head by which the film formation is enabled with such a stable film thickness is replaced with the shower head 5, the film thickness is prevented from fluctuating due to the replacement. Thus, the film-forming process can be performed similar to that before the replacement is performed. As shown in the evaluation tests described later, by forming the coating film 54 described above, the reflectance of the shower head 5 is close to that of the comparative shower head in which the film forming process and the cleaning process are repeatedly performed.

The cleaning gas seems to relatively contribute largely to the change in the reflectance of the shower head. Based on that fact, the above-mentioned "the reflectance is close" will be described in more detail. For example, when infrared rays having an arbitrary wavelength in the range of 3 µm to 7 µm are radiated to the front surface of the shower head 5, namely the coating film 54, the reflectance of the infrared rays in the coating film 54 will be referred to as a first reflectance. Further, when the infrared rays having the above-mentioned arbitrary wavelength is radiated to the front surface of the comparative shower head exposed to the cleaning gas, namely the front surface of the base 53, the reflectance of the infrared rays in the base 53 will be referred to as a second reflectance. For example, when a ratio of the first reflectance to the second reflectance is 0.8 to 1.2, the reflectances are deemed to be close to each other, which is preferable. More specifically, the base 53 exposed to the cleaning gas is one that has been exposed to the cleaning gas for at least one hour, for example, in the state of being heated to a temperature of 150 degrees C. or higher at which the cleaning process is performed.

Returning back to FIG. 1, the description will be continued. Downstream ends of the pipes 61 and 71 are connected to upstream ends of the gas introduction paths 41 and 42 of the ceiling plate 4, respectively. An upstream end of the pipe 61 is coupled to a gas source 64A of a TiCl$_4$ gas used as a processing gas through a valve V1, a gas storage tank 62A, and a flow rate adjuster 63A in this order. The gas storage tank 62A temporarily stores the TiCl$_4$ gas supplied from the gas source 64A before being supplied into the processing container 11. After the TiCl$_1$ gas is stored in this way and an internal pressure of the gas storage tank 62A is increased to a predetermined pressure, the TiCl$_4$ gas is supplied from the gas storage tank 62A to the gas introduction path 41. The supply and cutoff of the TiCl$_4$ gas from the gas storage tank 62A to the gas introduction path 41 is performed by opening and closing the valve V1. By temporarily storing the TiCl$_4$ gas in the gas storage tank 62A as described above, it is possible to supply the TiCl$_4$ gas into the processing container 11 at a relatively large flow rate. Similar to the gas storage tank 62A, gas storage tanks 62B, 62D, and 62E, which constitute gas storage parts (to be described later), temporarily store gases supplied from respective gas sources provided at upstream sides of respective pipes. In addition, by opening and closing valves V2, V4, and V5 respectively provided at downstream sides of the gas storage tanks 62B, 62D and 62E, the supply and cutoff of gases from the respective gas storage tanks 62B, 62D and 62E to the gas introduction paths 41 and 42 are performed.

A downstream end of the pipe 65 is connected to the downstream side of the valve V1 in the pipe 61 described above. An upstream end of the pipe 65 is connected to a source 64B of an N$_2$ gas through the valve V2, the gas storage tank 62B, and a flow rate adjuster 63B in this order. In addition, a downstream end of a pipe 66 is connected to a downstream side of the valve V2 in the pipe 65. An upstream end of the pipe 66 is coupled to a source 64C of an $N_2$ gas through a valve V3 and a flow rate adjuster 63C in this order. A downstream end of a pipe 67 is connected to a downstream side of the valve V3 in the pipe 66. An upstream side of the pipe 67 is branched into two pipes through a valve V7 and a flow rate adjuster 63G in this order. End portions of the branched pipes are respectively connected to a cleaning gas source 64G and an $N_2$ gas source 64I. Therefore, it is possible to supply the cleaning gas and/or the $N_2$ gas to the downstream side of the flow rate adjuster 63G in the pipe 67.

An upstream end of the pipe 71 connected to the gas introduction path 42 is coupled to a source 64D of an $NH_3$ gas through the valve V4, the gas storage tank 62D, and a flow rate adjuster 63D in this order. A downstream end of a pipe 72 is connected to a downstream side of the valve V4 in the pipe 71. An upstream end of the pipe 72 is coupled to a source 64E of an $N_2$ gas through the valve V5, the gas storage tank 62E, and a flow rate adjuster 63E in this order. In addition, a downstream end of a pipe 73 is connected to a downstream side of the valve V5 in the pipe 72. An upstream end of the pipe 73 is coupled to a source 64F of an $N_2$ gas through a valve V6 and a flow rate adjuster 63F in this order. In addition, a downstream end of a pipe 74 is connected to a downstream side of a valve V6 in the pipe 73. An upstream end of the pipe 74 is branched into two pipes through a valve V8 and a flow rate adjuster 63H in this order. End portions of the branched pipes are respectively connected to a cleaning gas source 64H and an $N_2$ gas source 64J. Therefore, it is possible to supply the cleaning gas and/or the $N_2$ gas to the downstream side of the flow rate adjuster 63H in the pipe 74. The cleaning gas sources 64G, 64H, and 33 constitute a cleaning gas supply part.

The $N_2$ gases supplied from the above-mentioned $N_2$ gas sources 64B and 64E are supplied into the processing container 11 in order to perform the purging process described above. The $N_2$ gas supplied from each of the $N_2$ gas sources 64C and 64F is a carrier gas for the $TiCl_4$ gas and the $NH_3$ gas. The carrier gas is continuously supplied into the processing container 11 during the processing of the wafer W as described above. Thus, the carrier gas is also supplied to the processing container 11 when performing the purging process. Therefore, a time period during which the carrier gas is supplied into the processing container 11 overlaps a time period during which the $N_2$ gases from the gas sources 64B and 64E are supplied into the processing container 11 to perform the purging process. Thus, the carrier gas is also used for the purging process. In this specification, for the sake of convenience in illustration, the gas supplied from each of the $N_2$ gas sources 64B and 64E will be referred to as a purge gas, and the gas supplied from each of the $N_2$ gas sources 64C and 64F will be referred to as a carrier gas.

The film-forming apparatus 1 includes a controller 10. The controller 10 is configured with a computer, and includes a program, a memory, and a CPU. The program incorporates a group of steps for allowing the film-forming apparatus 1 to perform a series of operations described later. Based on the program, the controller 10 outputs a control signal to each part of the film-forming apparatus so as to control the operation of each part. Specifically, respective operations such as opening and closing of each of the valves V1 to V8 and V34, adjustment of the flow rates of the gases by the flow rate adjusters 63A to 63H and 34A, adjustment of the internal pressure of the processing container 11 by the exhaust mechanism 17, and adjustment the temperature of the wafer W by the heater 22 are controlled by control signals. The above-mentioned program may be stored in a storage medium such a compact disk, a hard disk, or a DVD, and is installed in the controller 10.

Figure 3:
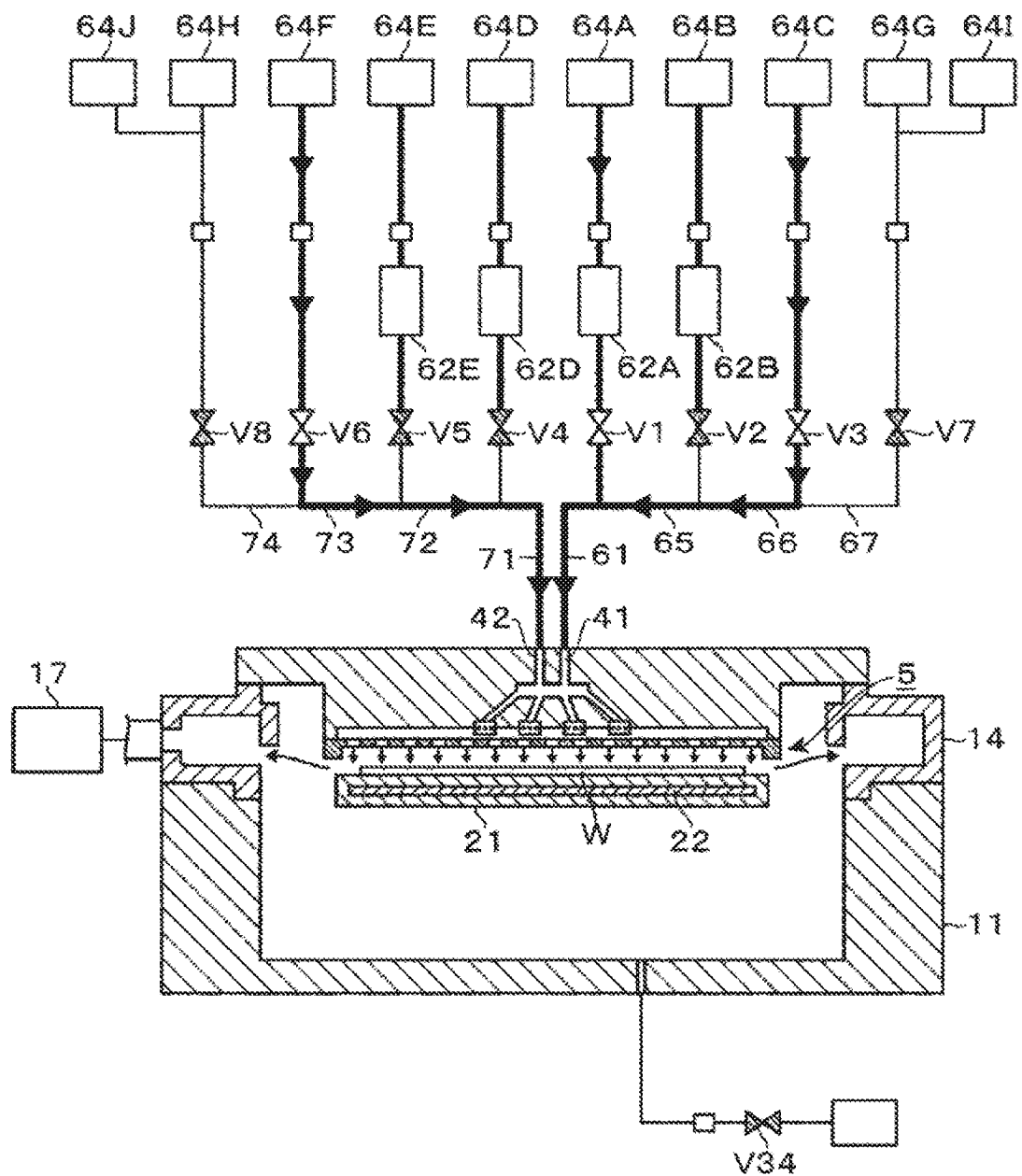
FIG. 3 is a schematic view for explaining a process performed by the film-forming apparatus.
Figure 4:
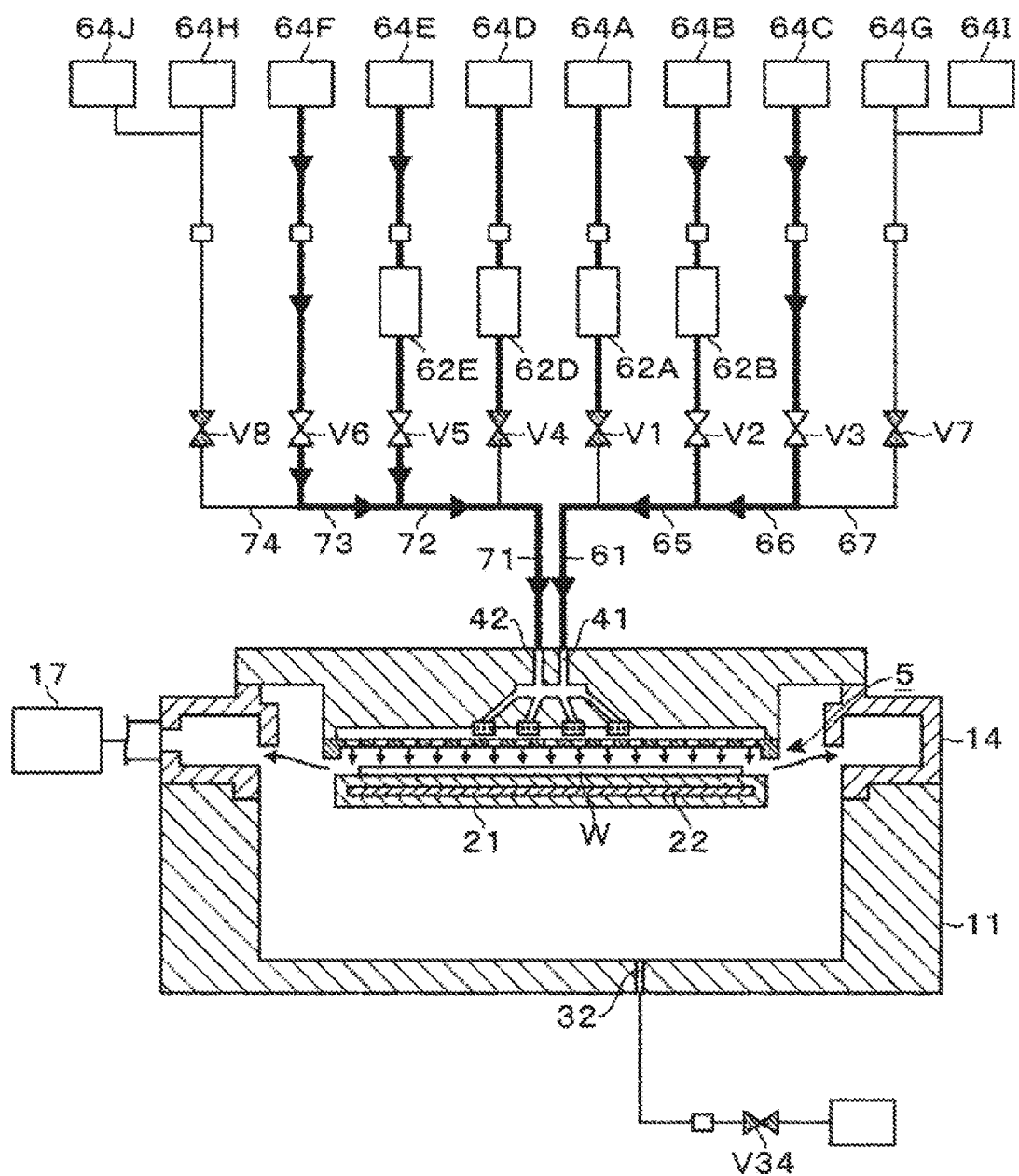
FIG. 4 is a schematic view for explaining a process performed by the film-forming apparatus.

Next, a film-forming process performed in the film-forming apparatus 1 will be described with reference to FIGS. 3 to 5, which illustrate the opening/close state of each valve and the flow state of a gas in each pipe. In FIGS. 3 to 5, and FIGS. 6 and 7 for explaining the cleaning described later, the valves V remaining in a closed state are indicated by hatching so as to distinguish them from the valves V remaining in an opened state. In FIGS. 3 to 7, in the pipes 61, 65 to 67, 71 to 74, and 34, portions through which a gas is flowing downward are indicated in bold compared with portions through which no gas is flowing.

First, in the state in which the valves V1 to V8 are closed, the wafer W is transferred into the processing container 11 and is mounted on the stage 21 at the lower position. Thereafter, the gate valve 13 is closed, and the wafer W is heated to 400 degrees C. or higher (e.g., 450 degrees C.) by the heater 22 of the stage 21. The stage 21 is moved to the upper position. Meanwhile, the inside of the processing container 11 is evacuated by the exhaust mechanism 17 so that the internal pressure of the processing container 11 becomes a predetermined vacuum pressure.

The valves V3 and V6 are opened, and the carrier gas ($N_2$ gas) is supplied from each of the $N_2$ gas sources 64C and 64F into the gas introduction paths 41 and 42, respectively. Meanwhile, the $TiCl_4$ gas and the $NH_3$ gas are supplied into the pipes 61 and 71 from the gas source 64A and the gas source 64D, respectively. Since the valves V1 and V4 remain in the closed state, the $TiCl_4$ gas and the $NH_3$ gas are stored in the gas storage tanks 62A and 62D, respectively. Thus, the internal pressures of the gas storage tanks 62A and 62D are increased. Thereafter, as illustrated in FIG. 3, the valve V1 is opened, and the $TiCl_4$ gas stored in the gas storage tank 62A is supplied from the shower head 5 toward the wafer W.

In parallel to the supply of the $TiCl_4$ gas toward the wafer W, the purge gas ($N_2$ gas) is supplied from each of the gas sources 64B and 64E into the pipes 65 and 72, respectively. Since the valves V2 and V5 remain in the closed state, the purge gas is stored in each of the gas storage tanks 62B and 62E, and the internal pressure of each of the gas storage tanks 62B and 62E is increased. Thereafter, as illustrated in FIG. 4, the valve V1 is closed and the valves V2 and V5 are opened. As a result, the supply of the $TiCl_4$ gas into the processing container 11 is stopped, and the purge gas stored in each of the gas storage tanks 62B and 62E is supplied from the shower head 5. The $TiCl_4$ gas remaining around the wafer W is purged toward the exhaust duct 14.

Subsequently, as illustrated in FIG. 5, the valves V2 and V5 are closed and the valve V4 is opened. As a result, the $NH_3$ gas stored in the gas storage tank 62D is supplied from the shower head 5 instead of the purge gas. This facilitates the nitriding reaction of the $TiCl_4$ gas adsorbed in the plane of the wafer W to form a thin layer of TiN as a reaction product. Meanwhile, when the valves V2 and V5 remain in the closed state, the purge gases which are respectively supplied from the gas sources 64B and 64E into the pipes 65 and 72, are stored in respective gas storage tanks 62B and 62E, so that the internal pressure of each of the gas storage tanks 62B and 62E is increased.

Thereafter, the valve V4 is closed and the valves V2 and V5 are opened. Respective valves remain in the same as the opened/closed state illustrated in FIG. 4. As a result, the supply of the $NH_3$ gas into the processing container 11 is stopped, and the purge gas stored in each of the gas storage tanks 62B and 62E is ejected from the shower head 5, so that the NH$_3$ gas remaining around the wafer W is purged toward the exhaust duct 14. Meanwhile, the valve V4 is closed, and the purge gas supplied from the gas source 64D into the pipe 71 is stored in the gas storage tank 62D, so that the internal pressure of the gas storage tank 62D is increased.

A cycle of supplying the TiCl$_4$ gas, the purge gas, the NH$_3$ gas, and the purge gas toward the wafer W in this order is assumed to be one cycle. This cycle is repeatedly performed. A thin layer of TiN is deposited on the front surface of wafer W so that a TiN film is formed. After the cycle is performed a predetermined number of times, the wafer W is unloaded from the processing container 11.

After predetermined sheets of wafers W are subjected to the film-forming process as described above, the cleaning process is performed. Hereinafter, the procedure of this cleaning process will be described. In a state in which no wafer W is stored in the processing container 11, the stage 21 is positioned at the upper position. In the state in which each valve is closed, the inside of the processing container 11 is kept in a vacuum atmosphere of a predetermined pressure, and the stage 21 is heated to a predetermined temperature of, for example, 150 degrees C. to 250 degrees C. by the heater 22.

Figure 6:
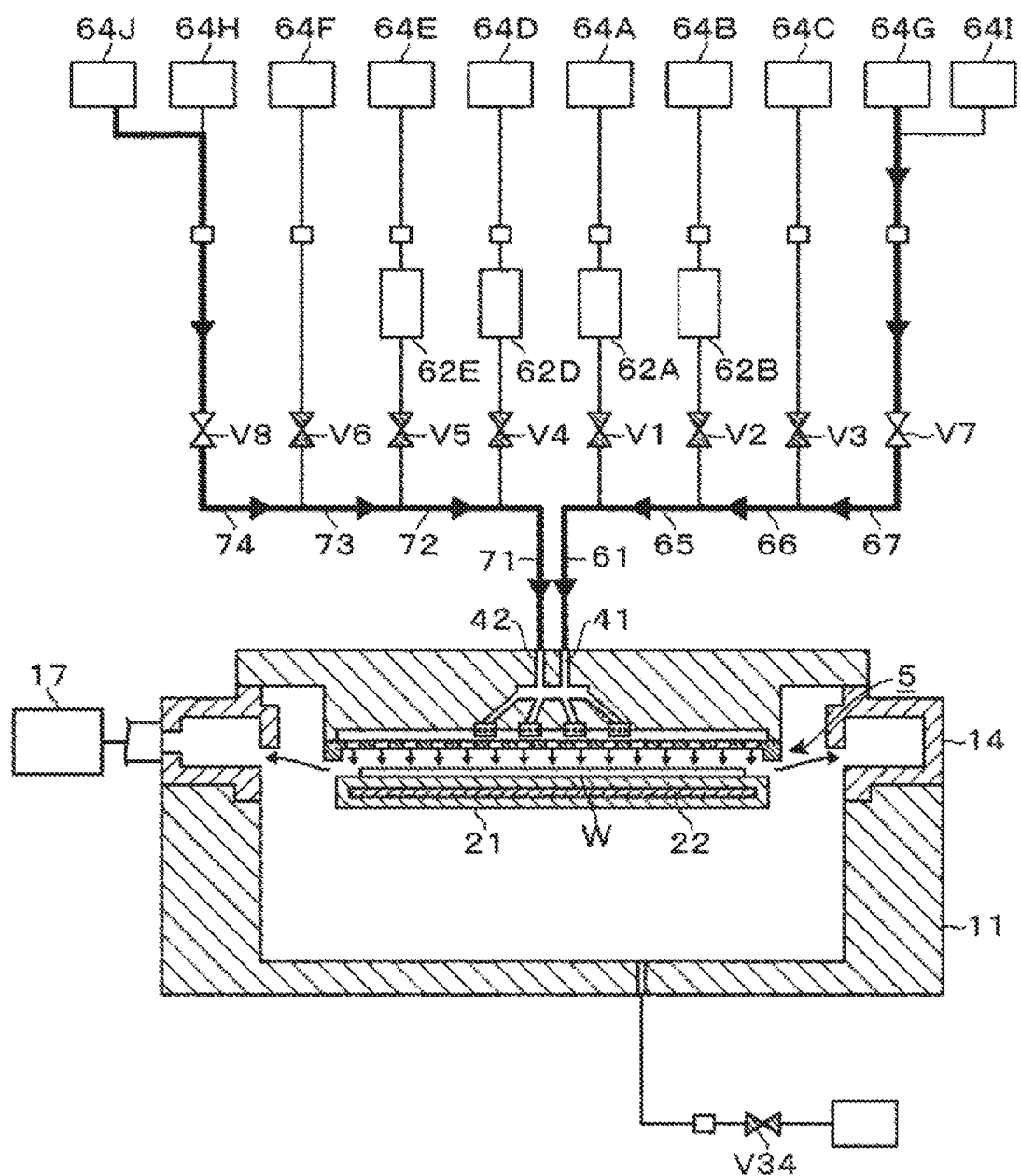
FIG. 6 is a schematic view for explaining a process performed by the film-forming apparatus.
Figure 7:
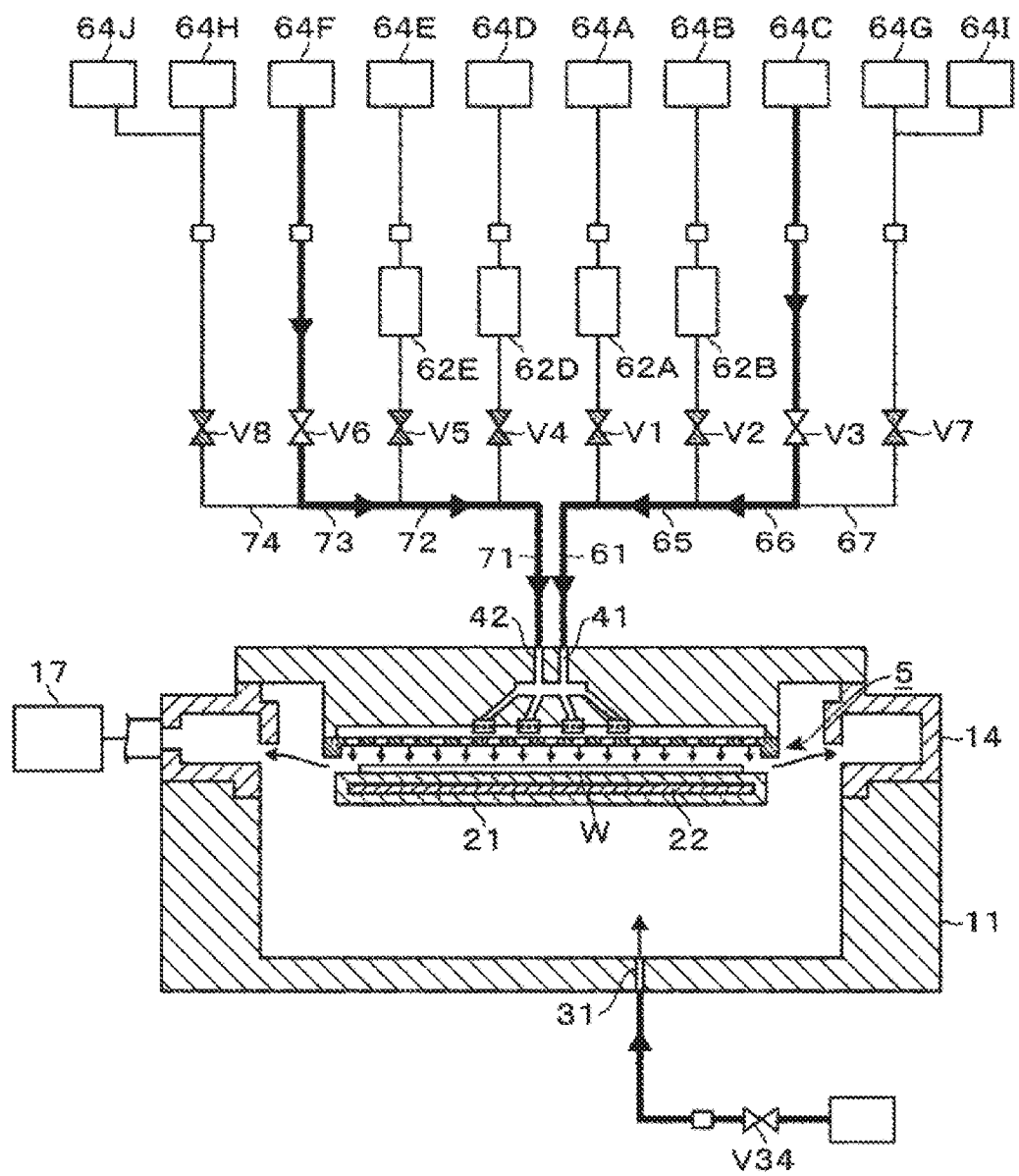
FIG. 7 is a schematic view for explaining a process performed by the film-forming apparatus.

The valves V7 and V8 are opened, and the cleaning gas is supplied to the gas introduction path 41 through the pipe 67, and the N$_2$ gas is supplied to the gas introduction path 42 through the pipe 74, so that the cleaning gas and the N$_2$ gas are supplied from the shower head 5 (FIG. 6). As a result, the film adhering to the upper portion of the processing container 11 and the gas introduction path 41 is removed. Subsequently, the gas supplied to the gas introduction path 41 through the pipe 67 is switched from the cleaning gas to the N$_2$ gas, and the gas supplied to the gas introduction path 42 through the pipe 74 is switched from the N$_2$ gas to the cleaning gas (not shown). As a result, the film adhering to the upper portion of the processing container 11 and the gas introduction path 42 is removed.

Thereafter, for example, the valves V7 and V8 are closed, the cleaning gas is supplied from the gas supply port 31 (FIG. 7), so that the film adhering to the lower portion of the processing container 11 is removed. At this time, for example, the valves V3 and V6 are opened, and the N$_2$ gas is ejected from the shower head 5. As described above, the cleaning gas is sequentially supplied from the gas introduction path 41, the gas introduction path 42, and the gas supply port 31. Subsequently, the stage 21 moves to the lower position. The opened/closing states of the valves are controlled in the same manner as when the stage 21 is positioned at the upper position, and the cleaning gas is supplied in order from the gas introduction path 41, the gas introduction path 42, and the gas supply port 31 to perform film removal. Thereafter, each valve is closed to end the cleaning process. After the cleaning process, the wafer W is transferred into the processing container 11 as described above, and the film-forming process is resumed. The film-forming process is performed on predetermined sheets of wafers W again and the cleaning process is performed again. In this manner, the film-forming process and the cleaning process are sequentially performed on the predetermined sheets of wafers W in a repetitive manner.

As described above, the coating film 54 is formed on the front surface of the shower head 5. Thus, even if the film-forming process and the cleaning process are repeatedly performed as described above, the reflectance of heat on the front surface of the shower head 5 at the time of respective film-forming processes are made to be uniform. This suppresses a fluctuation in temperature of the wafer W in each film forming process. Therefore, the gases supplied to the wafer W during each film-forming process reacts with each other in the same manner. Therefore, as described above, by performing the cycle a predetermined number of times, a TiN film of a desired thickness is formed on the wafer W, which suppresses a fluctuation in film thickness of the TiN film between the wafers W. In an actual case, after completion of the cleaning process, before performing film formation on the wafer W and before performing an initial film-forming process on the wafer W, respective gases are supplied in the same manner as in the film-forming process of the wafer W in the state in which no wafer W is stored in the processing container 11 so as to perform formation (pre-coating) of a TiN film. The pre-coating is similar to the film-forming process performed on the wafer W and thus description thereof is omitted.

Figure 8:
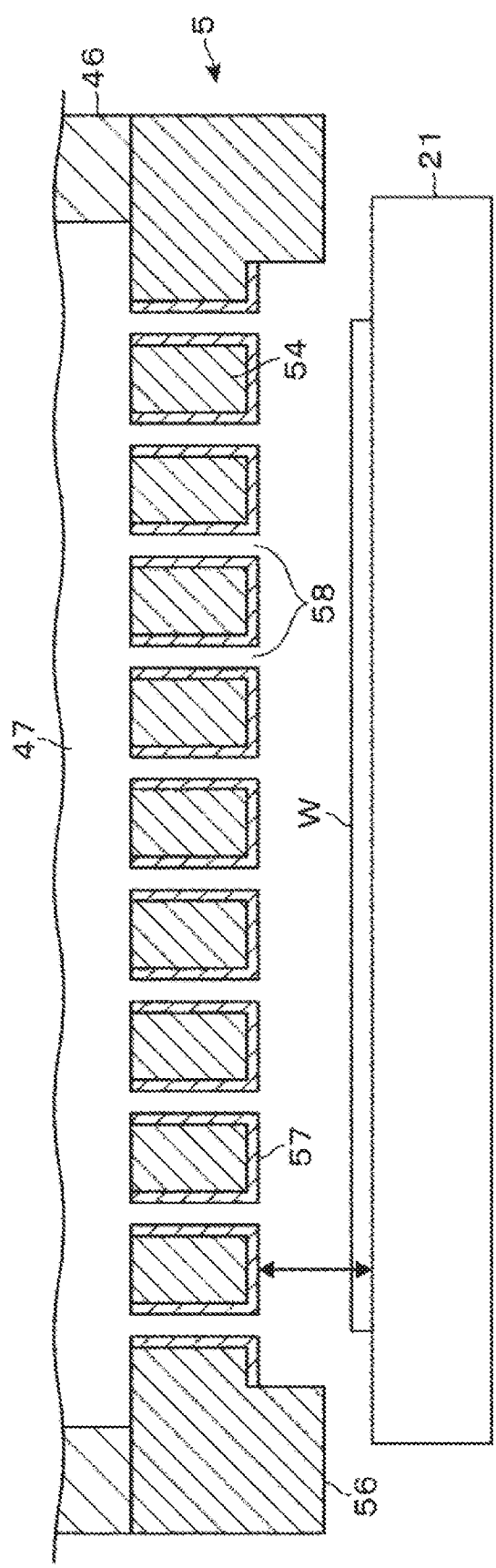
FIG. 8 is a cross-sectional view illustrating another exemplary configuration of the shower head.

Although the coating film 54 have been described to be formed on the entire front surface of the shower head 5 by the surface treatment described above, the present disclosure is not limited thereto. As described above, the coating film 54 is provided to suppress the fluctuation in heat reflection in the facing portion 57 that faces the front surface of the stage 21. Thus, the coating film 54 may be formed at least on the facing portion 57. FIG. 8 illustrates an example in which the coating film 54 is formed only on a portion including the facing portion 57 of the shower head 5. In this example, the coating film 54 is not formed on the upper surface, the side circumferential surface, and the annular protrusion 56 of the shower head 5. The shower head 5 having such a configuration may be manufactured by forming the coating film 54 on the entire front surface of the shower head 5 through the surface treatment described above, and polishing and removing redundant portions from the coating film 54.

In some embodiments, the coating film 54 may formed by forming a porous layer, followed by performing a sealing treatment on the porous layer to modify the porous layer into a non-porous layer. Alternatively, the coating film 54 may formed by plating or the like. In addition, although the coating film 54 have been described to be formed only on the shower head 5 in the film-forming apparatus 1, the coating film 54 may be formed on an inner wall surface of the processing container 11 or the like other than the shower head 5.

The shower head 5 is not limited to the above-mentioned aluminum alloy A5052 according to the JIS standard, but may be made of another aluminum alloy, aluminum, or a metal containing no aluminum. Alternatively, a film made of a material other than alumite may be used as the coating film 54. Although the ClF$_3$ gas have been described to be used as the cleaning gas, the ClF$_3$ gas is not limited to be made of such a compound. The film formed on the wafer W in the film-forming apparatus 1 is not limited to the TiN film. Thus, the cleaning gas may be appropriately selected depending on a film to be formed in the film-forming apparatus 1. In addition, the film-forming method used in the film-forming apparatus 1 is not limited to the ALD. As an example, the shower head 5 may be applied to a film-forming apparatus that performs CVD. It should be noted that the embodiments described herein are exemplary in all respects and are not restrictive. The above-described embodiments may be omitted, replaced or modified in various forms without departing from the scope and spirit of the appended claims.

(Evaluation Tests)

Next, tests conducted in relation to the described-above film-forming apparatus of the present disclosure will be described.

<Evaluation Test 1>

In Evaluation Test 1-1, for the shower head 5 including the base 53 of A5052 according to the JIS standard and the coating film 54 described in the above embodiment, a spectrum showing a relationship between a wavelength of infrared rays radiated to the shower head 5 and a reflectance of the infrared rays was obtained. In Evaluation Test 1-2, a shower head in which the base 53 of A5052 according to the JIS standard is exposed, namely the above-described comparative shower head, was exposed to the cleaning gas (the $ClF_3$ gas). Then, as in Evaluation Test 1-1, a spectrum showing a relationship between a wavelength of radiated infrared rays and ae reflectance of the infrared rays was obtained.

Figure 9:
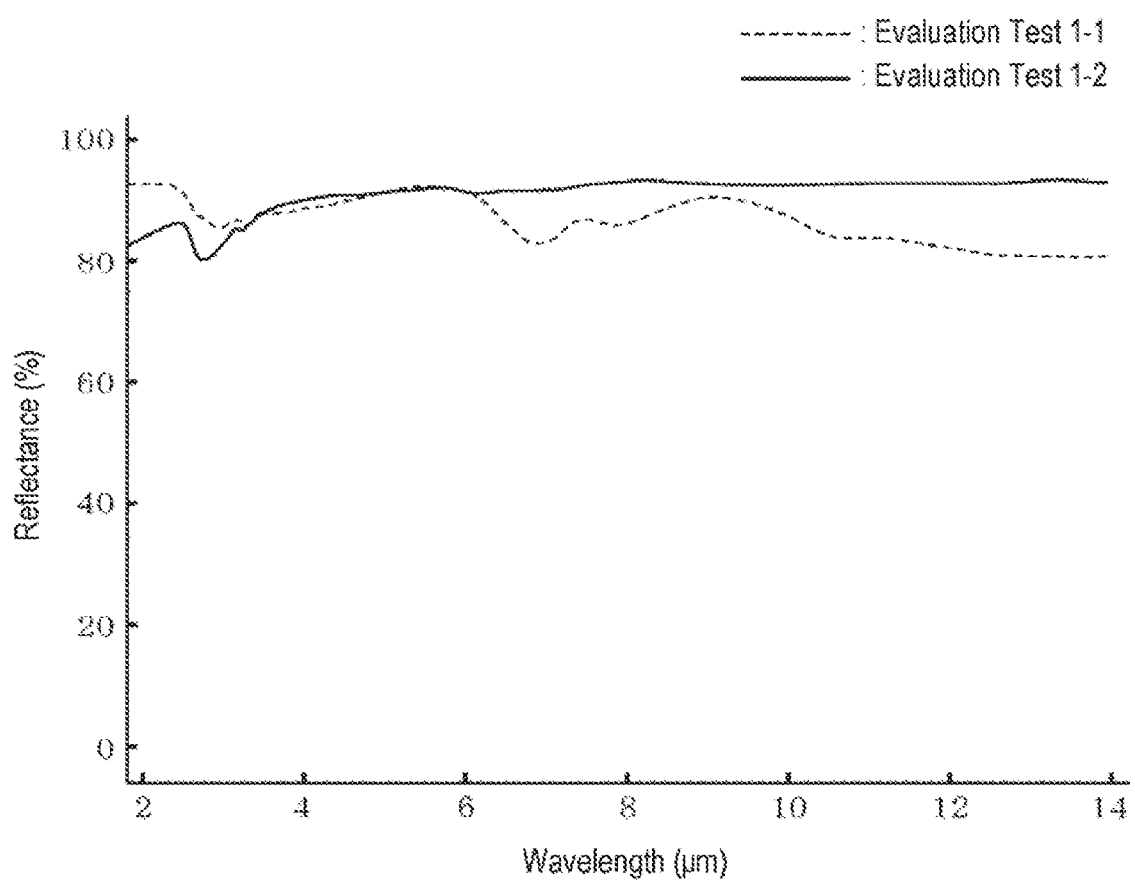
FIG. 9 is a graph representing the results of an evaluation test.

FIG. 9 is a graph representing the spectrums of Evaluation Tests 1-1 and 1-2. The horizontal axis in the graph represents a wavelength (unit: μm), and the vertical axis in the graph represents a reflectance (%). The waveform of the spectrum showing the results of Evaluation Test 1-1 is indicated by a dotted line, and the waveform of the spectrum showing the results of Evaluation Test 1-2 is indicated by a solid line. In the wavelength range of 3 μm to 7 μm, a difference between the reflectance of Evaluation Test 1-1 and the reflectance of Evaluation Test 1-2 when the wavelengths are the same is relatively small, and the reflectance thereof are close to each other as described above. Therefore, even if the shower head 5 is used instead of the comparative shower head, it is estimated that it is possible to suppress a fluctuation in film thickness of a film formed on the wafer W before and after the replacement of the shower head. In addition, it can be seen from the graph that the reflectance of the coating film 54 is 80% to 92% in the wavelength range of 3 μm to 7 μm in Evaluation Test 1-1. That is to say, it is preferable to form a coating film having such a reflectance.

<Evaluation Test 2>

In Evaluation Test 2-1, the film-forming process was performed on 1000 sheets of wafers W using the film-forming apparatus 1 provided with the shower head 5 under the same processing conditions such that thicknesses of formed films become equal to each other. The cleaning process was appropriately performed in the course of processing the plurality of wafers W. For each of the wafers W which have been subjected to the film-forming process, film thicknesses at plural locations in a plane of the wafer W were measured. An average value of the film thicknesses and a range of the film thicknesses (a difference between the maximum value and the minimum value) were calculated. Evaluation test 2-2 was conducted in substantially the same manner as in Evaluation Test 2-1. However, in Evaluation Test 2-2, the wafers W were processed using the film-forming apparatus 1 including the comparative shower head instead of the shower head 5. The shower heads used in Evaluation Tests 2-1 and 2-2 are new ones and therefore are not exposed to the cleaning gas at the start of the tests.

Figure 10:
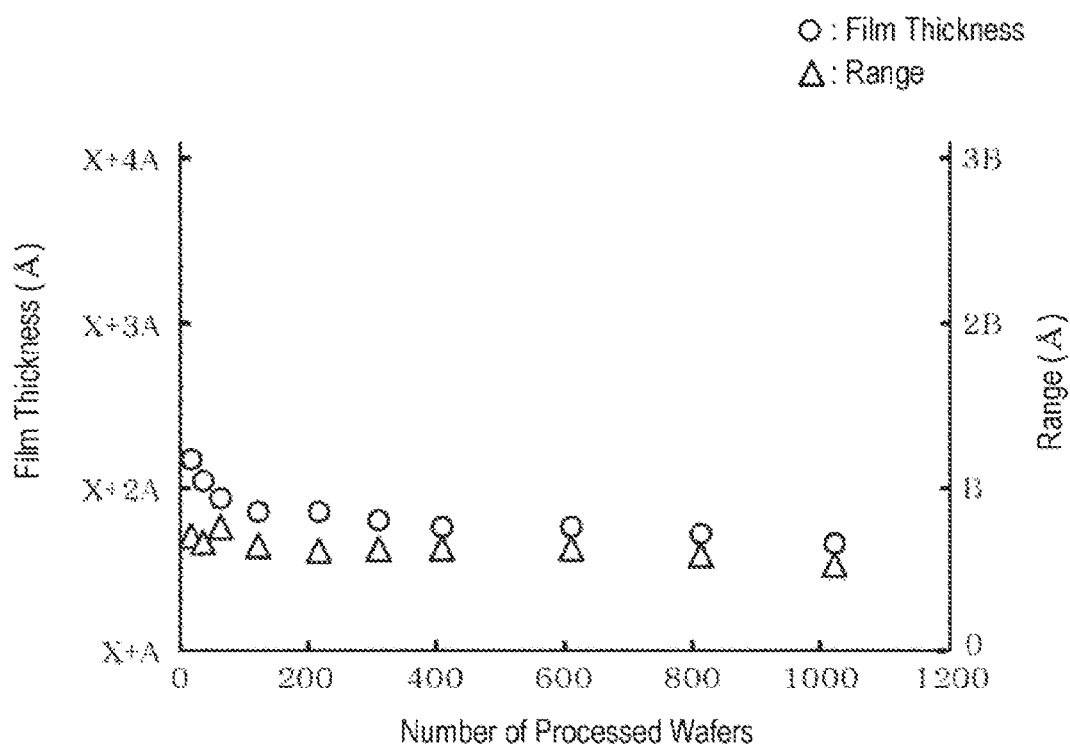
FIG. 10 is a graph representing the results of an evaluation test.
Figure 11:
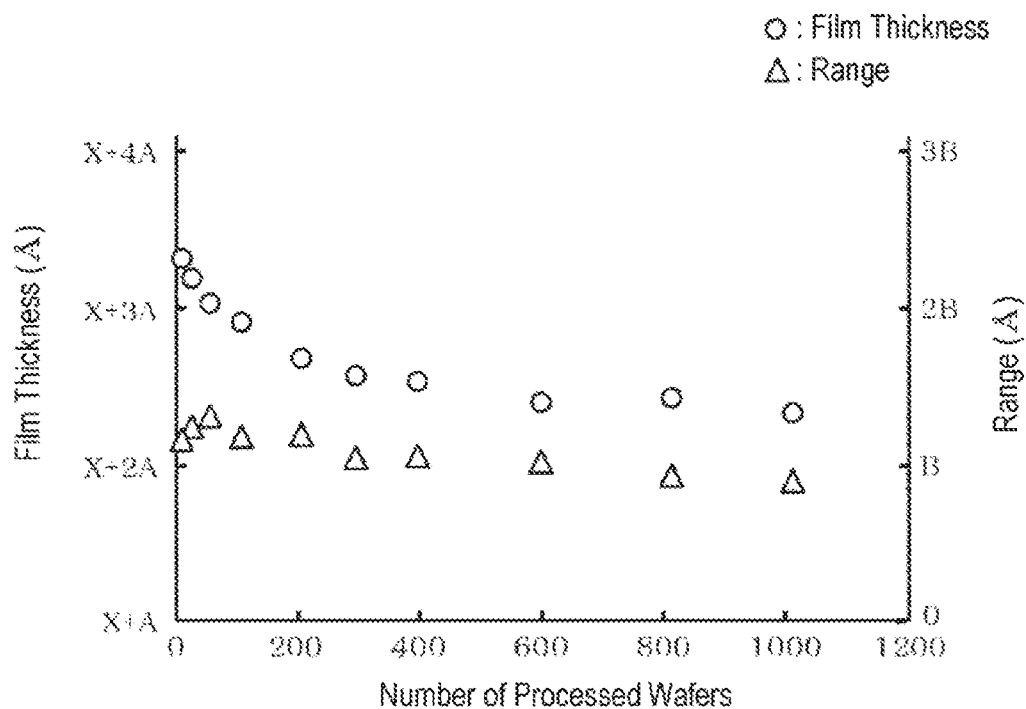
FIG. 11 is a graph representing the results of an evaluation test.

FIG. 10 is a graph showing the results of Evaluation Test 2-1, and FIG. 11 is a graph showing the results of Evaluation Test 2-2. In each of these graphs, the horizontal axis represents the accumulated number of wafers W processed from the start of the test, and the vertical axis represents the average value (unit: Å) and range (unit: Å) of film thicknesses. X, A, and B in the vertical axis of each graph are positive integers.

As represented in FIGS. 10 and 11, in the range of the film thicknesses, no significant change was observed depending on the accumulated number of processed wafers W in both of Evaluation Tests 2-1 and 2-2. However, in Evaluation Test 2-2, the average value of the film thicknesses decreased relatively largely as the accumulated number of processed wafers W increases. However, in Evaluation Test 2-1, even if the accumulated number of wafers W increases, no significant change was observed in the average value of the film thicknesses. It was confirmed that $1\sigma$ % for the average value of the film thicknesses (=(standard deviation a/average value)×100%) is 0.9% in Evaluation test 2-1 and 1.8% in Evaluation Test 2-2, and the fluctuation in the average value of the film thicknesses is smaller in Evaluation Test 2-1 than in Evaluation Test 2-2. Accordingly, it was confirmed from Evaluation Test 2 that it is possible to suppress the fluctuation in the film thickness between the wafers W by using the shower head 5 on which the coating film 54 is formed.

According to the present disclosure in some embodiments is capable of suppressing a fluctuation in film thickness between a plurality of substrates when performing a film-forming process on the substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film-forming apparatus comprising:
    a vacuum container having a vacuum atmosphere formed therein configured for a film forming process on each of a plurality of substrates;
    a stage provided within the vacuum container and configured to heat the substrate mounted on the stage;
    a shower head including a facing portion formed to face the stage and a plurality of gas ejection ports opened in the facing portion, the shower head configured to supply a film-forming gas to the substrate heated through the plurality of gas ejection ports so as to form a film on the substrate;
    a cleaning gas supply part configured to supply a cleaning gas into the vacuum container to clean an interior of the vacuum container in a state where no substrate is accommodated in the vacuum container while the film forming process is applied on each of the plurality of substrates; and
    a non-porous coating film configured to cover a base material constituting the shower head at least in the facing portion and form a surface of the shower head, such that a fluctuation in a heat reflectance in the shower head when the film-forming gas is supplied to each of the plurality of substrates is alleviated,
    wherein the stage is further configured to emit an infrared ray when heating the substrate, and
    wherein a reflectance of the coating film with respect to the infrared ray having an wavelength ranging from 3 μm to 7 μm is a first reflectance, and a reflectance of the base material exposed to the cleaning gas with respect to the infrared ray having the wavelength is a second reflectance, a ratio of the first reflectance to the second reflectance is 0.8 to 1.2.

2. The film-forming apparatus of claim 1, wherein the base material is a metal including aluminum, and the coating film is an alumite film.

3. The film-forming apparatus of claim 2, wherein the base material is A5052 according to JIS (Japanese Industrial Standard).

4. The film-forming apparatus of claim 1, wherein the base material is heated to a temperature of 400 degrees C. or higher when the film-forming gas is supplied.

5. The film-forming apparatus of claim 1, wherein the cleaning gas is a chlorine trifluoride gas.

6. The film-forming apparatus of claim 1, wherein a reflectance of an infrared ray having a wavelength of 3 μm to 7 μm in the coating film is 80% to 92%.

* * * * *